United States Patent
Ohshima et al.

(10) Patent No.: US 6,522,600 B2
(45) Date of Patent: Feb. 18, 2003

(54) FAST CYCLE RAM AND DATA READOUT METHOD THEREFOR

(75) Inventors: Shigeo Ohshima, Yokohama (JP); Nobuo Watanabe, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/163,797

(22) Filed: Jun. 4, 2002

(65) Prior Publication Data

US 2002/0149993 A1 Oct. 17, 2002

Related U.S. Application Data

(63) Continuation of application No. 09/749,008, filed on Dec. 27, 2000, now Pat. No. 6,426,915.

(30) Foreign Application Priority Data

Dec. 28, 1999 (JP) .......................................... 11-373531

(51) Int. Cl.[7] ................................................. G11C 8/00
(52) U.S. Cl. ..................... 365/233; 365/63; 365/189.08; 365/230.06
(58) Field of Search ..................... 365/233, 63, 189.01, 365/189.08, 230.06

(56) References Cited

U.S. PATENT DOCUMENTS

| 5,550,784 | A | 8/1996 | Takai | ........................ 365/233 |
| 6,061,294 | A | 5/2000 | Koshikawa | ................ 365/233 |
| 6,088,291 | A | 7/2000 | Fujioka et al. | |
| 6,108,243 | A | 8/2000 | Suzuki et al. | .......... 365/189.01 |
| 6,307,806 | B1 | 10/2001 | Tomita et al. | .............. 365/233 |
| 6,426,915 | B2 * | 7/2002 | Ohshima et al. | ............ 365/233 |

FOREIGN PATENT DOCUMENTS

JP     WO98/56004     12/1998

OTHER PUBLICATIONS

Yasuharu Sato et al., Fast Cycle RAM (FCRAM); A 20-ns Random Row Access, Pipe-Lined Operating DRAM, LVSI Symposium 1998.

* cited by examiner

*Primary Examiner*—David Nelms
*Assistant Examiner*—Gene N. Auduong
(74) *Attorney, Agent, or Firm*—Hogan & Hartson, LLP

(57) ABSTRACT

A semiconductor memory device comprises first and second pins, a controller, a first command decoder and a lower-side command decoder. The controller is supplied with a signal indicating that a read command is input and a signal indicating that a write command is input based on the signal input to the first pin. The first command decoder is controlled by an output signal of the controller, defines the readout/write operation by use of the first command, fetches an upper-side decode address of a memory cell array via the second pin and decodes the first command. A lower-side command decoder is controlled by an output signal of the controller, fetches a lower-side decode address of the memory cell array via the control pin in response to the second command, decodes the lower-side command, and outputs a lower address latch command, mode register set command and auto-refresh command.

5 Claims, 14 Drawing Sheets

FIG. 7A

| FUNCTION | SYMBOL | PIN NAME | | | | | |
|---|---|---|---|---|---|---|---|
| | | $\overline{CS}$ | FN ($\overline{RAS}$) | A14 ($\overline{WE}$) | A13 ($\overline{CAS}$) | BA1-0 | A12-0 |
| DESELECT | DESL | H | X | X | X | X | X |
| READ WITH AUTO-CLOSE | RDA | L | H | UA | UA | BA | UA |
| WRITE WITH AUTO-CLOSE | WRA | L | L | UA | UA | BA | UA |

FIG. 7B

| FUNCTION | SYMBOL | PIN NAME | | | | | |
|---|---|---|---|---|---|---|---|
| | | $\overline{CS}$ | FN ($\overline{RAS}$) | A14 ($\overline{WE}$) | A13 ($\overline{CAS}$) | BA1-0 | A12-0 |
| LOWER ADDRESS LATCH | LAL | L | X | V | V | V | LA |
| MODE REGISTER SET | MRS | L | X | L | L | L | V |
| AUTO-REFRESH | REF | L | X | X | X | X | X |

FAST CYCLE RAM AND DATA READOUT METHOD THEREFOR

CROSS-REFERENCE TO RELATED APPLICATIONS

This is a continuation of application Ser. No. 09/749,008 filed Dec. 27, 2000 now U.S. Pat. No. 6,426,915, which application is hereby incorporated by reference in its entirety.

This application is based upon and claims the benefit of priority from the prior Japanese Patent Application No. 11-373531, filed Dec. 28, 1999, the entire contents of which are incorporated herein by reference.

BACKGROUND OF THE INVENTION

This invention relates to a semiconductor memory device and a data readout method therefor and more particularly to a fast cycle synchronous DRAM (SDR-FCRAM) having a function of rapidly reading/writing random data from or into a memory cell array in synchronism with a clock signal and a data readout method for a double data rate synchronous DRAM (DDR-FCRAM) for realizing the data transfer rate twice that of the above DRAM.

In order to enhance the data access speed of a DRAM to that of an SDRAM and attain a large data band width (the number of data bytes for each unit time) by use of a high clock frequency (cycle time tCK), a synchronous DRAM (SDRAM) is invented and is already put into practice from the 4-Mbit or 16-Mbit DRAM generation.

Recently, in order to further enhance the operation speed of the SDRAM, a double data rate SDRAM which is operated at the data transfer rate twice that of the conventional SDRAM by operating the same in synchronism with both of the rise edge and fall edge of a clock signal is proposed and actively commercialized.

In order to enhance the data transfer rate, the data bandwidth is actively increased, but it is difficult to enhance the speed of random access to cell data in a memory core, that is, the sped of data access to a row address which has been changed to indicate a different row. This is because the cycle time (random cycle time=tRC) of the memory core cannot be greatly reduced since a certain period of time (which is referred to as core latency) is required for the destructive readout and amplifying operation inherent to the DRAM and the precharge operation prior to the next access to the memory core.

In order to solve the above problem, a so-called fast cycle RAM (FCRAM) in which access to the memory core and the precharge operation thereof are pipelined to reduce the random cycle time to half of that of the conventional DRAM or less is proposed and will be started to be commercialized mainly in the network field in which random data of a router or LAN switch using SRAMs in the prior art is transferred at high speed.

The basic system of the data readout operation of the FCRAM is described in International Application (International Publication Number W098/56004 (Fujioka et al.)) based on Jpn. Pat. Appln. Nos. H09-145406, H09-215047 and H09-332739 used as the basic application, for example.

This invention is to improve the data readout operation of the FCRAM defined in the above International Application and relates to the improvement of a method for supplying a row access instruction and column access instruction.

First, the basic system and the operation of data readout in the FCRAM disclosed in the above International Application are briefly explained with reference to FIGS. 1 to 5. FIGS. 1 to 3 correspond to FIGS. 4 to 6 in International Publication No. W098/56004.

FIG. 1 is a principle diagram for reducing or shortening the random cycle time tRC in the FCRAM and shows a row-series pipeline operation. FIG. 2 is a detail timing chart of an internal operation for realizing the pipeline operation. FIG. 3 is a timing chart for illustrating the operation for enhancing the row access speed by the self-precharge operation. FIG. 4 shows an example of a command input method at the readout time defined in the FCRAM. FIG. 5 is a command status diagram in the data readout system described in the above International Application.

In FIGS. 2 and 3, WL indicates the potential of a word line, BL, $\overline{BL}$ indicate the potentials of paired bit lines, SAE indicates an enable signal of a bit line sense amplifier, CSL indicates a signal (which is the potential of the column selection line) selected according to a column address, for transferring data on the bit line pair BL, $\overline{BL}$ amplified by the bit line sense amplifier to a peripheral data bus, EQL is a precharge/equalizing signal for the paired bit lines, ACT indicates a row access command and RD is a column access command.

In FIG. 4, BA0 to BA3 indicate a bank address, A0 to A10 indicate an address, UA indicates an upper address, LA0 to LA9 indicate a lower address, and LA1, LA0 among the lower address LA0 to LA9 indicate a burst address.

In FIG. 5, DESL indicates a deselect operation, POWER DOWN indicates a power down operation, MODE REGISTER indicates a mode register, WRITE indicates a write operation, IDLE indicates a 50% adder latched, READ indicates a read operation, AUTO-REFRESH indicates an auto-refresh operation, SELF-REFRESH indicates a self-refresh operation, PDEN indicates a power down command, PDEX indicates a power down release command, MRS indicates a mode register set command, ACT indicates a row access command (first command), RD indicates a read column access command (second command), REF indicates a auto refresh command, WR indicates a write access command, SELF indicates a self-refresh command and SELFX indicates a self-refresh release command.

In order to enhance the speed of random data readout from a memory cell array, it is considered that the following three stages are pipelined as shown in FIG. 1:

(1) command decoding operation and peripheral circuit operation;

(2) sense amplification operation; and (3) data output operation.

In this case, in the DRAM, the longest time is required for the stage (2), that is, for "word line selection cycle"+"sense amplifier driving cycle"+"reset cycle (sense amplification cycle)" as shown in the timing chart of FIG. 2. In order to reduce the time to minimum, instead of decoding the row address, subjecting data read out from the memory cell MC connected to the selected word line WL to the differential amplification by the bit line sense amplifier S/A, terminating the restore operation, and then successively opening the column selection gates in response to a plurality of column addresses by use of the column selection lines CSL to make burst access as in the conventional SDRAM, it is necessary to read out data of a necessary burst length to the bit line sense amplifier S/A so as to instantly terminate the sense amplifying operation (stage (2)) by simultaneously opening a plurality of column selection gates larger in number than the SDRAMs after the restore operation is terminated and then effect the reset (precharge) cycle in the shortest time while the data outputting operation (stage (3)) is being effected.

In order to realize the above operation, the operation based on the timing chart shown in FIG. 3 is required. The feature of the operation shown in FIG. 3 is that a row access command ATC and column access command RD (in this case, it indicates "read") are supplied to the FCRAM as one packet. The commands are supplied in response to successive clock input pulses so that the command interval will become minimum and the command cycle time can be reduced. By fetching the row access command ACT and column access command RD in synchronism with the two successive clocks, it becomes possible to fetch a column address CAi which is fetched at the same time as the column access command RD at earlier timing, thereby making it possible to select a column selection line CSL at earlier timing. Further, as a secondary effect, part of the column address CAi can be used as an address for dividing the sense amplifiers, and therefore, the number of sense amplifiers to be operated is limited in comparison with the conventional DRAM and the operation speed of the stage (2) can be enhanced.

AS shown in FIG. 5, in the above readout method, a row address is latched in response to input of a first command ACT in the deselect state (standby state) to start the operation of the row-series peripheral circuit. Next, part of the column address CAi is used as a row address for decoding the sense amplifier by use of the second command RD (column access command for "read") or $\overline{WR}$ (column access command for "write") and access to the thus limited memory core is started. Then, after termination of the access, the deselect state is automatically restored.

However, the above command system has the following problem. That is, since the row access command is supplied only for decoding the command and starting the operation of the peripheral circuit, the operations of the stages (2) and (3) cannot be started until a column access command RD ("read" in this case) is input one cycle after the present cycle. Therefore, the random cycle time tRC is defined by an interval between the row access commands ACT and ACT or between the column access commands RD and RD and can be reduced without causing any problem, but data access from the row access command ACT, that is, random access time tRAC will contain an extra one clock cycle.

In order to cope with this, in the above International Application, a system for simultaneously inputting the row access command ACT and column access command RD is proposed. However, in this system, since the command decoding operation is extremely complicated and the logic construction of the internal circuit becomes larger, there occurs a possibility that extra delay time occurs in the front half part of the random access time tRAC. Further, since the command decoding operation becomes complicated, the number of input pins of the device may be increased in many cases and there occurs a possibility that the package size will be increased and the cost will rise.

As described above, in the conventional semiconductor memory device, if the row access command and column access command are given as one packet in order to enhance the speed of random data readout from the memory cell array, data access from the row access command, that is, the random access time will contain an extra one clock cycle without fail.

In order to solve this problem, a system for simultaneously inputting the row access command and column access command is proposed, but in this case, since the command decoding operation is extremely complicated and the logic construction of the internal circuit becomes larger, there occurs a possibility that extra delay time occurs in the front half part of the random access time. Further, there occurs a possibility that the package size will be increased and the cost will rise due to an increase in the number of input pins of the device.

BRIEF SUMMARY OF THE INVENTION

According to an aspect of the present invention, there is provided a semiconductor memory device in which first and second commands are input to effect a read/write operation of random data with respect to a memory cell array in synchronism with a clock signal and a row access command and a column access command for data readout are supplied as one packet in two successive clock cycles, comprising: a first pin supplied with a signal which distinguishes a read command and a write command; second pins supplied with upper-side and lower-side decode addresses; a controller to which a signal indicating that the read command is input and a signal indicating that the write command is input based on the signal input to the first pin are supplied; a first command decoder controlled by an output signal of the controller, which defines the readout/write operation by use of the first command, fetches an upper-side decode address of a memory cell array via the second pin and decoding the first command; and a lower-side command decoder controlled by an output signal of the controller, which fetches a lower-side decode address of the memory cell array via the control pin in response to the second command, decodes the lower-side command and outputs a lower address latch command, mode register set command and auto-refresh command.

BRIEF DESCRIPTION OF THE SEVERAL VIEWS OF THE DRAWING

FIGS. 7A and 7B are diagrams for illustrating the functions of commands shown in FIG. 6;

DETAILED DESCRIPTION OF THE INVENTION

Figure 1:
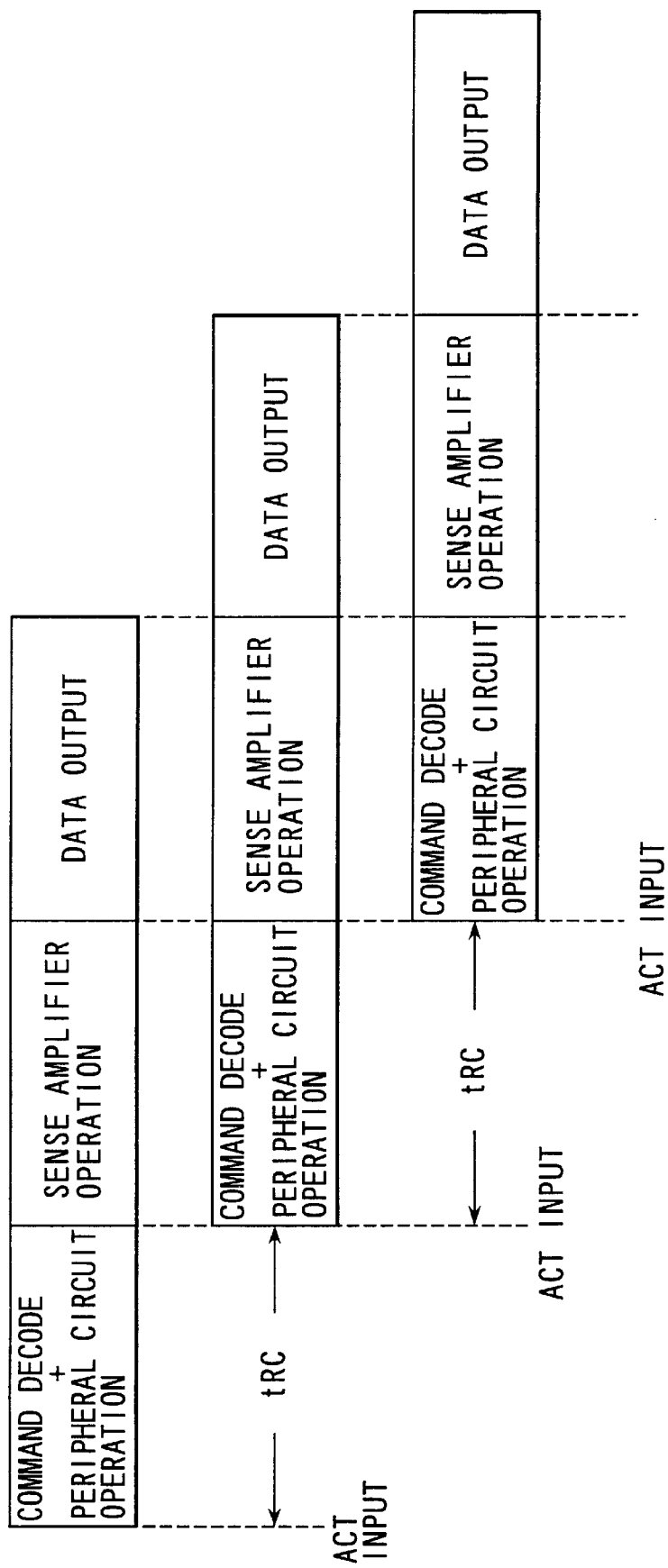
FIG. 1 is a schematic diagram showing the pipeline operation of a row series, for illustrating the principle of the operation for reducing the random cycle time in a conventional semiconductor memory device (FCRAM)
Figure 2:
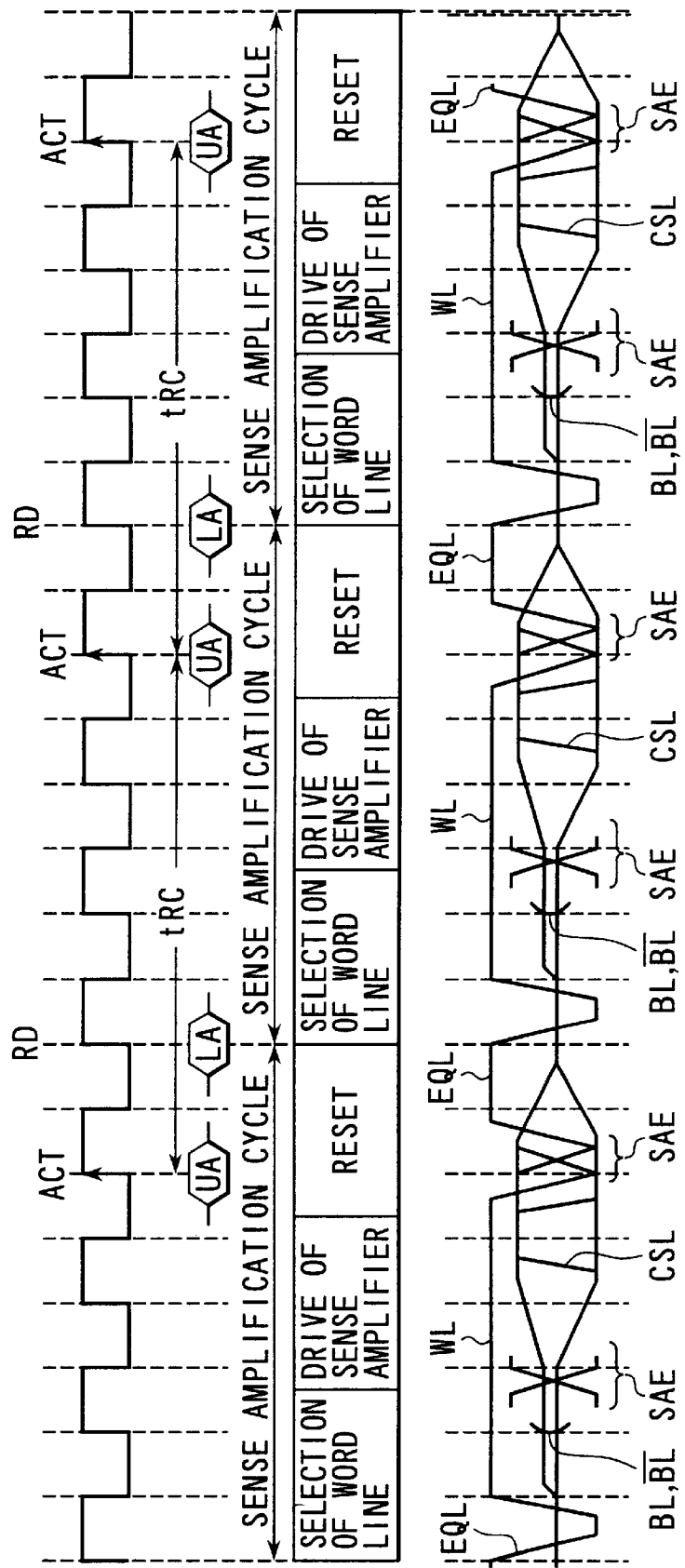
FIG. 2 is a detail timing chart of an internal operation, for realizing the pipeline operation shown in FIG. 1.
Figure 3:
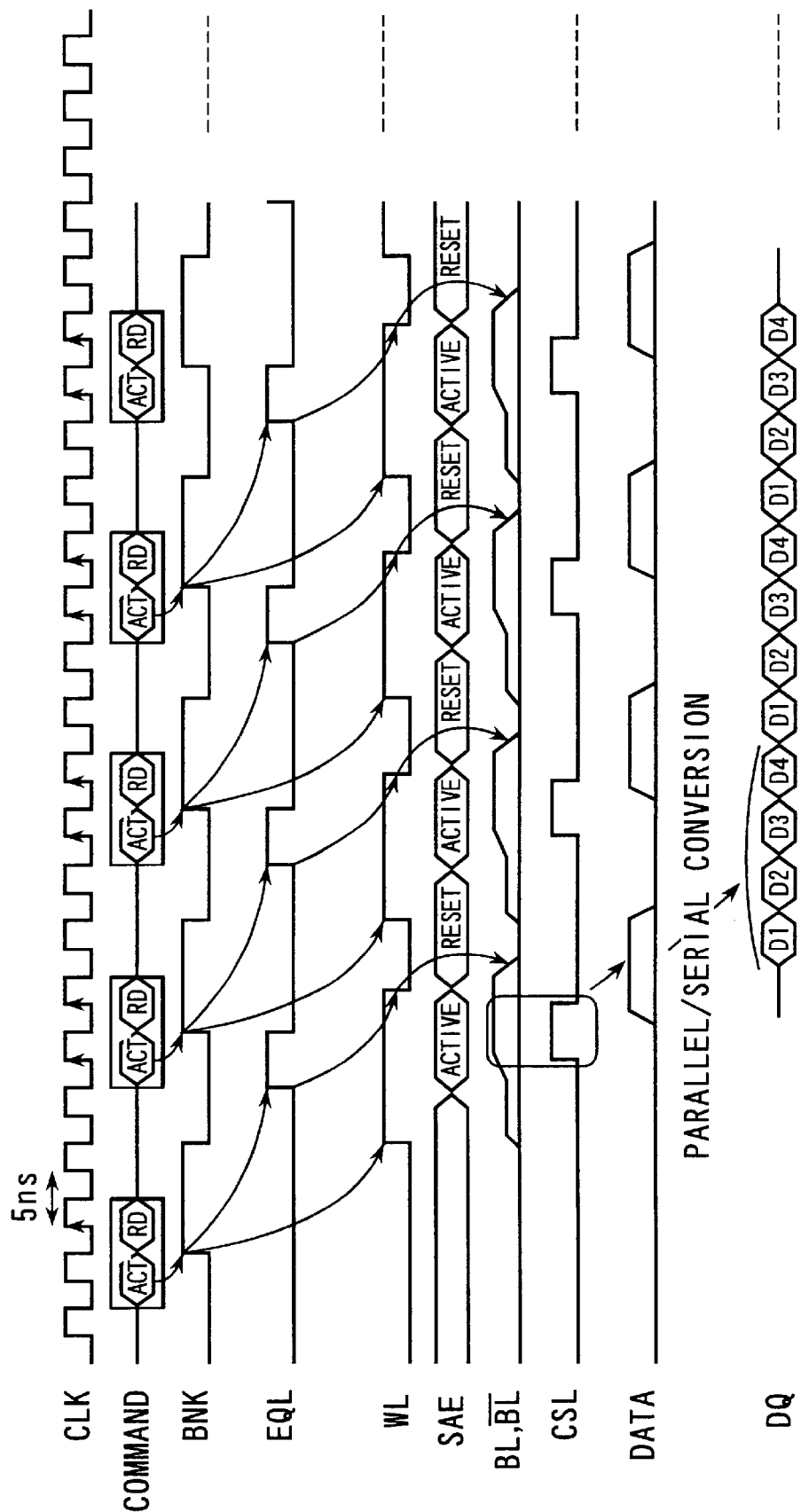
FIG. 3 is a detail timing chart of an internal operation, for realizing the improved pipeline operation of a conventional FCRAM.
Figures 4, 5:
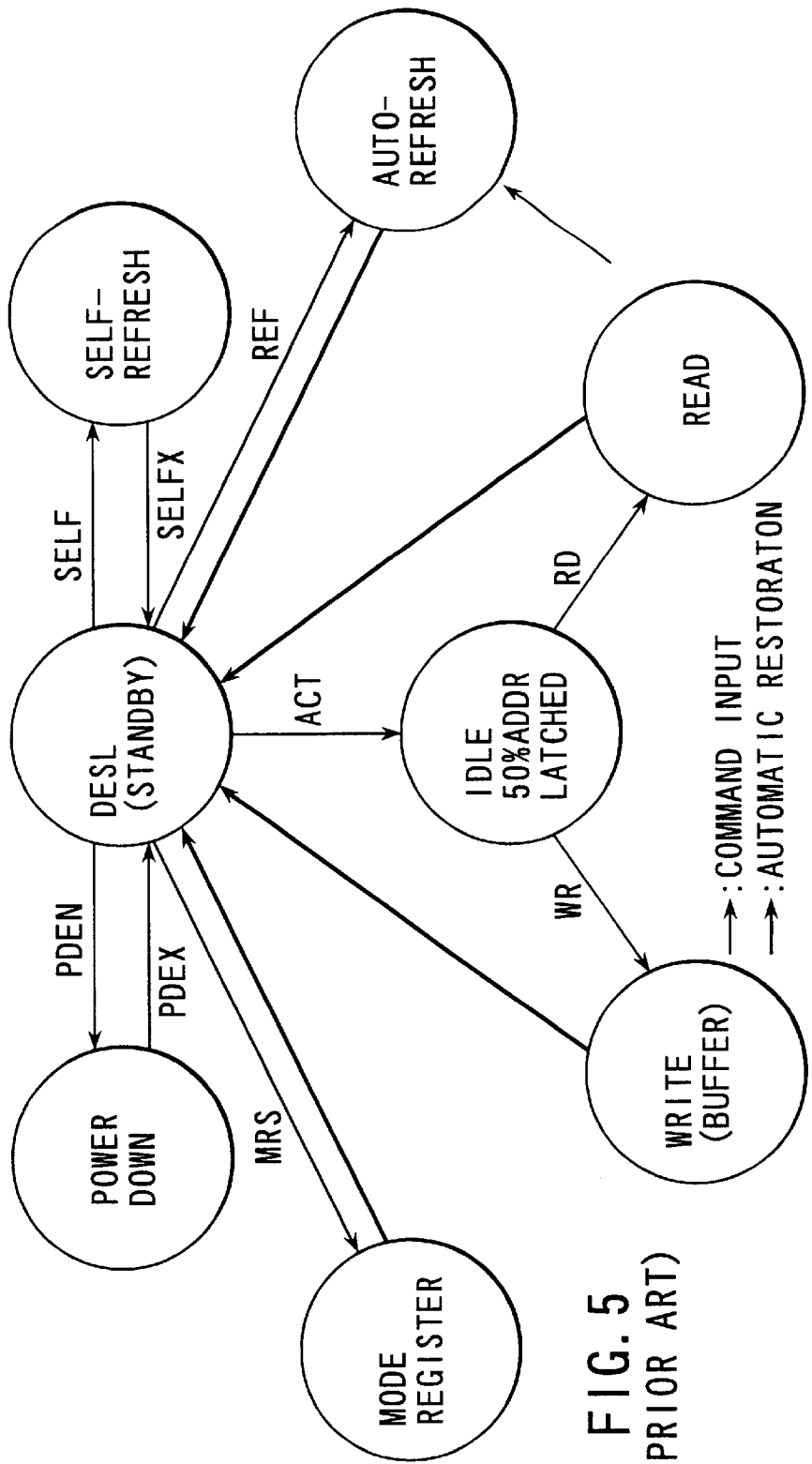
FIG. 4 is a diagram showing an example of a command input method at the readout time which is defined in the conventional FCRAM.
FIG. 5 is a command status diagram of the conventional FCRAM.
Figure 6:
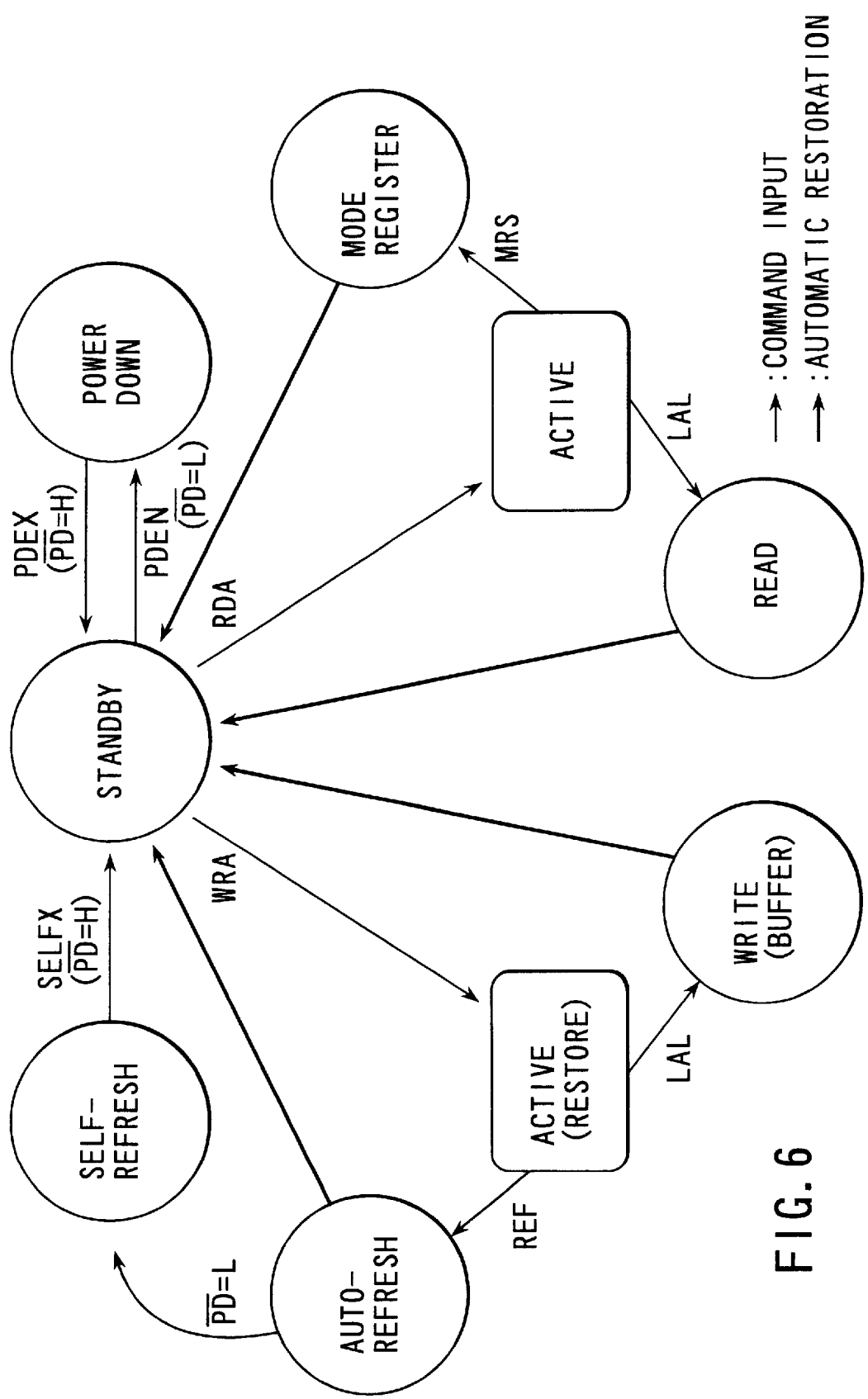
FIG. 6 is a command status diagram of an FCRAM, for illustrating a semiconductor memory device according to an embodiment of this invention.

FIGS. 6, 7A and 7B diagrams for illustrating a semiconductor memory device according to an embodiment of this invention. FIG. 6 is a command status diagram of an FCRAM (SDR/DDR-SDRAM) and FIGS. 7A and 7B are function tables thereof. That is, as shown in FIG. 6, a row address is fetched in response to input of a first command next to the standby state (STANDBY) and a read command (Read with Auto-close) RDA or write command (Write with Auto-close) WRA is directly supplied instead of the conventional row access command ACT for starting the operation of the peripheral row-series circuit. As is clearly understood from the function tables shown in FIGS. 7A and 7B, command input is accepted when the potential of a chip select pin $\overline{CS}$ provided on the SDR/DDR-SDRAM is set to the "L" level and distinction between the read and write commands is made by additionally providing an FN pin for defining the type of a command and using the level of a signal supplied to the pin. In this example, if a read command is supplied, the potential of the FN pin is set to the "H" level and if a write command is supplied, it is set to the "L" level.

In the conventional SDR/DDR-SDRAM, a divisional decoding row address for sense amplifiers which is supplied in a second command can be supplied in a first command in this invention. However, since the number of pins of a standard package is limited, existing control pins are used as address pins to suppress an increase in the number of pins. In this example, a $\overline{WE}$ (write enable) pin and $\overline{CAS}$ (column address strobe) pin in the SDR/DDR-SDRAM are used as address pins A13, A14. Thus, the advantage that the number of divisions of the sense amplifiers to be decoded is increased and the number of sense amplifiers to be activated is limited can be maintained.

Figure 8:
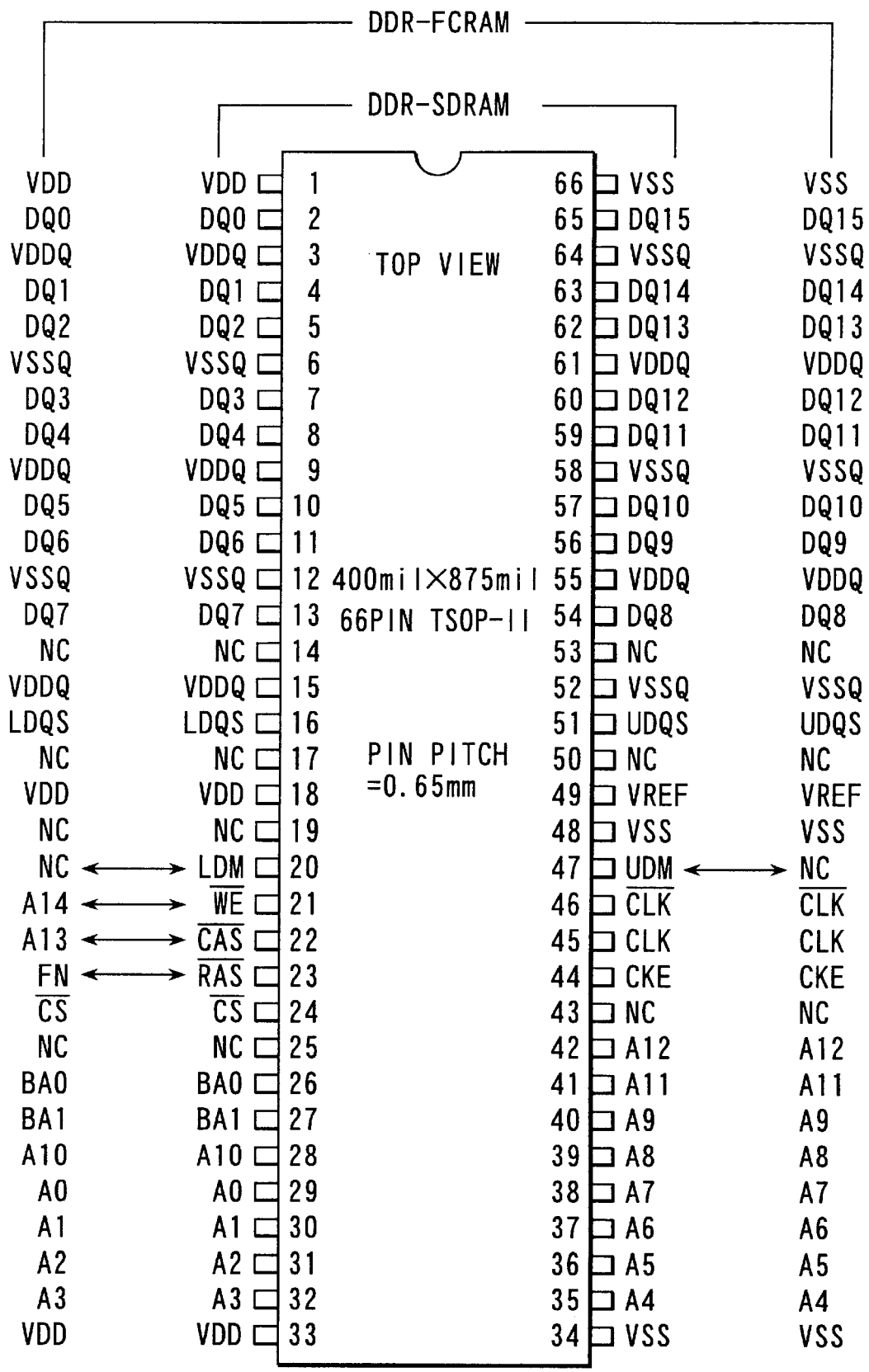
FIG. 8 is a top plan view showing the assignment of pins of a package of the FCRAM.

The assignment of pins on the package of the FCRAM based on the above system is shown in FIG. 8. This example is a 66-pin TSOP (Thin Small Outline Package) package which is standardized by JEDEC (joint Electron Device Engineering Council), and a row address RA0-i (since distinction of row/column is not necessary any more, an address fetched by use of the first command is referred to as an upper address UA and an address fetched by use of the second command is referred to as a lower address LA in FIG. 8) simultaneously supplied form the original $\overline{WE}$, $\overline{CAS}$ pins in response to the rise edge of a clock of the first command is fetched, and if the first command is a read command, a word line WL is selected according to the row address to read out data from the memory cell MC to a bit line pair BL, $\overline{BL}$ and the data is amplified by the bit line sense amplifier S/A. The operation described above is completed by input of the first command. In FIG. 8, $\overline{WE}$ and $\overline{CAS}$ are changed according to input of an address. Further, UDM and LDM are changed according to NC and $\overline{RAS}$ is changed according to FN.

Next, a lower address latch command LAL, mode register set command MRS and auto-refresh command REF are supplied as the second command one clock cycle after inputting of the read command RDA or write command WRA. At this time, since the read mode is determined by the first command and it is only necessary to supply a column address and output data, no complicated command set is required.

In FIG. 6, a case wherein the potential of the chip selection pin $\overline{CS}$ is set at the "H" level and a column address CA0-j (lower address LA) is fetched from the address pins is explained. As a result, at the time of input of the second command, a column address is simply fetched, a corresponding column selection line CSL is selected and data amplified by the bit line sense amplifier S/A is transferred to an MDQ line pair according to the first command, then amplified by a DQ read buffer DQRB again and finally output from an output pin DQ.

Figure 9:
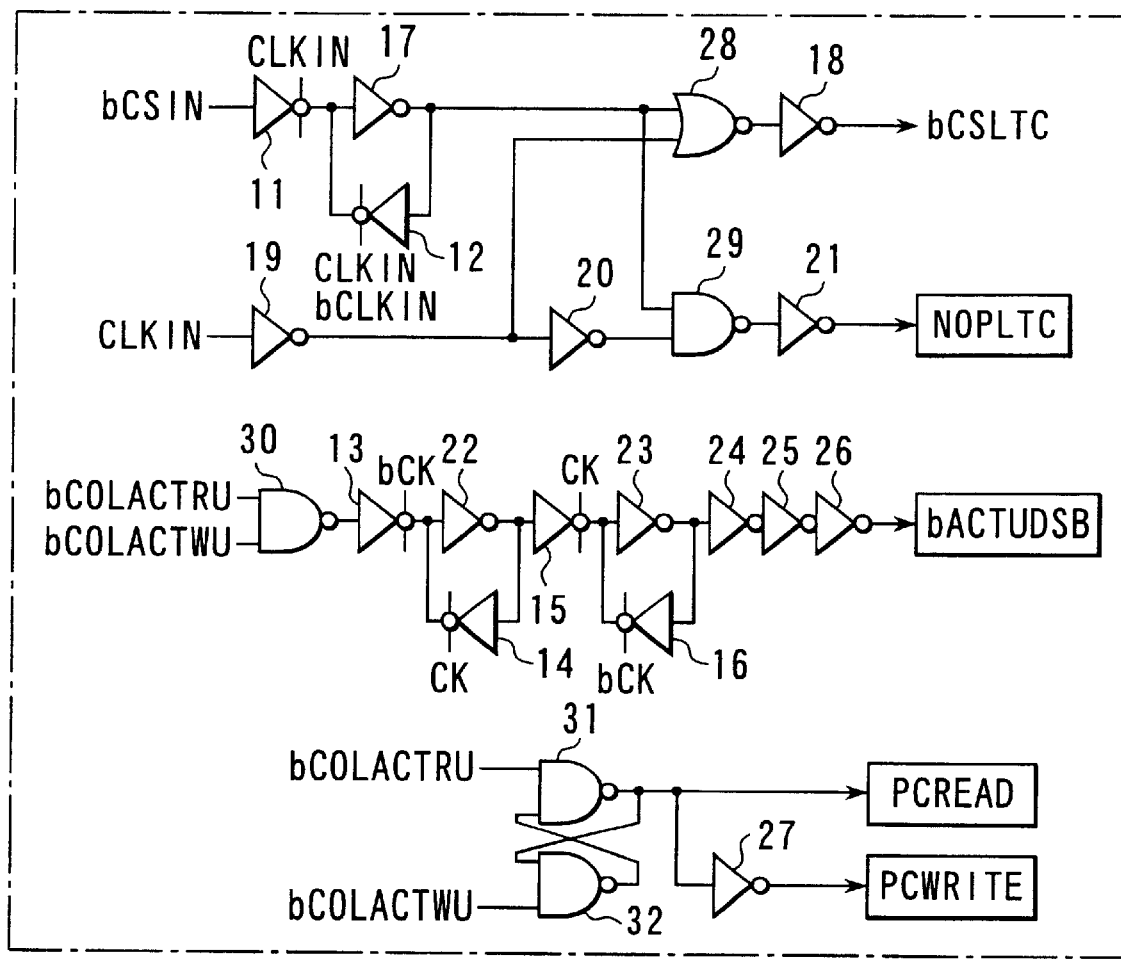
FIG. 9 is a circuit diagram showing an example of the concrete construction of a controller for controlling the operation of a command decoder.
Figure 10:
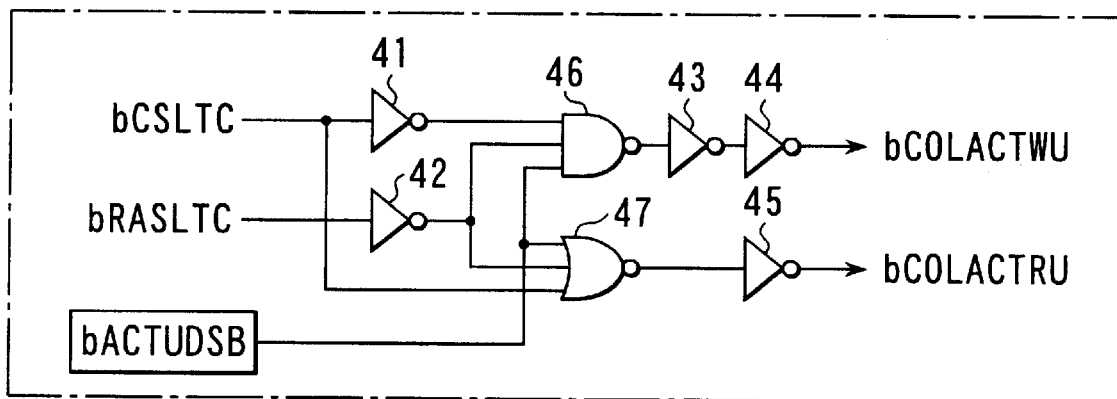
FIG. 10 is a circuit diagram showing an example of the concrete construction of an upper-side command decoder.
Figure 11:
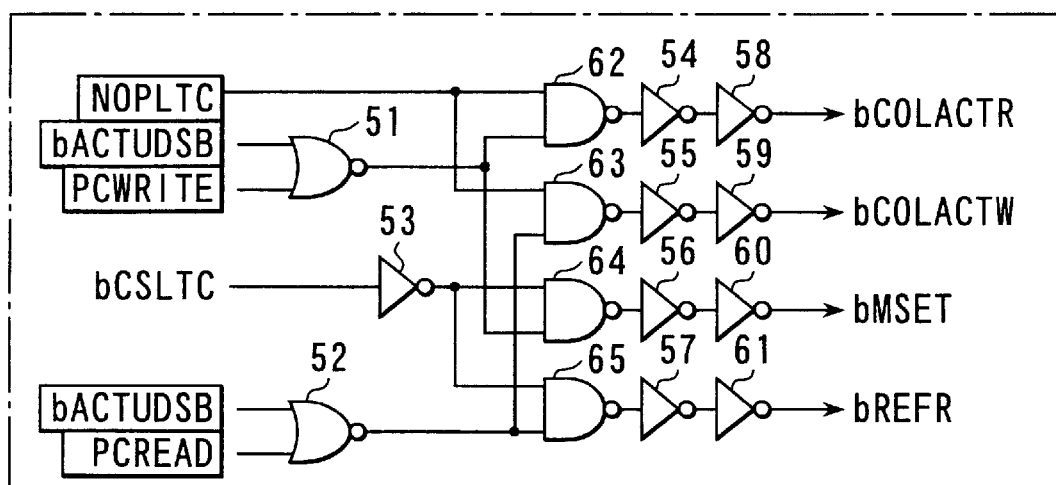
FIG. 11 is a circuit diagram showing an example of the concrete construction of a lower-side command decoder.

As shown in FIGS. 9 to 11, for example, the command decoder for realizing the above operation includes a controller, a decoder for the first command and a decoder for the second command. FIG. 9 is a circuit diagram showing an example of the concrete construction of the controller for controlling the operation of the command decoders. FIG. 10 is a circuit diagram showing an example of the concrete construction of an upper-side command decoder and FIG. 11 is a circuit diagram showing an example of the concrete construction of a lower-side command decoder.

As shown in FIG. 9, the controller includes clocked inverters 11 to 16, inverters 17 to 27, NOR gate 28 and NAND gates 29 to 32. A signal bCSIN obtained by buffering an external input $\overline{CS}$ in the internal portion is supplied to an input terminal of the clocked inverter 11 controlled by a signal CLKIN obtained by buffering an external input clock in the internal portion. The output terminal of the clocked inverter 11 is connected to the input terminal of the inverter 17 whose output terminal is connected to one-side input terminals of the NOR gate 28 and NAND gate 29. The output terminal of the NOR gate 28 is connected to the input terminal of the inverter 18. The output terminal of the clocked inverter 12 controlled by the signal CLKIN is connected to the input terminal of the inverter 17 and the input terminal thereof is connected to the output terminal of the inverter 17.

Further, the signal CLKIN is supplied to the input terminal of the inverter 19 and the output terminal of the inverter 19 is connected to the other input terminal of the NOR gate 28 and the input terminal of the inverter 20. The output terminal of the inverter 20 is connected to the other input terminal of the NAND gate 29. The output terminal of the NAND gate 29 is connected to the input terminal of the inverter 21. Then, a signal bCSLTC is output from the output terminal of the inverter 18 and a signal NOPLTC is output from the output terminal of the inverter 21.

A signal bCOLACTRU indicating that an RDA command is input and a signal bCOLACTWU indicating that an WRA command is input are supplied to the respective input terminals of the NAND gate 30. The output terminal of the NAND gate 30 is connected to the input terminal of the inverter 13 controlled by a signal bCK (equivalent to an inverted signal of the signal CLKIN obtained by buffering an external input clock in the internal portion). The output terminal of the clocked inverter 13 is connected to the input terminal of the inverter 22 and the output terminal of the inverter 14 controlled by a signal CK (equivalent to the signal CLKIN obtained by buffering an external input clock in the internal portion). The output terminal of the inverter 22 is connected to the input terminals of the clocked inverters 14, 15 controlled by the signal CK. The output terminal of the clocked inverter 15 is connected to the input terminal of the inverter 23 and the output terminal of the clocked inverter 16 controlled by the signal bCK. The output terminal of the inverter 23 is connected to the input terminal of the inverter 23 and the input terminal of the clocked inverter 16. The output terminal of the inverter 24 is connected to the input terminal of the inverter 25 whose output terminal is connected to the input terminal of the inverter 26. A signal bACTUDSB is output from the output terminal of the inverter 26.

One input terminal of the NAND gate 31 is supplied with a signal bCOLACTRU and the other input terminal thereof is connected to the output terminal of the NAND gate 32. One input terminal of the NAND gate 32 is supplied with a signal bCOLACTWU and the other input terminal thereof is connected to the output terminal of the NAND gate 31. A signal FCREAD is output from the output terminal of the NAND gate 31 and a signal PCWRITE is output from the output terminal of the inverter 27 whose input terminal is connected to the output terminal of the NAND gate 31.

As shown in FIG. 10, an upper-side command decoder includes inverters 41 to 45, NAND gate 46 and NOR gate 47. The input terminals of the inverters 41, 42 are respectively supplied with a signal bCSLTC obtained by buffering an external input $\overline{CAS}$ (FN) in the internal portion and latching the same by a half clock and a signal bRASLTC obtained by buffering an external input $\overline{RAS}$ (FN) in the internal portion and latching the same by a half clock. The first input terminal of the NAND gate 46 is connected to the output terminal of the inverter 41, the second input terminal thereof is connected to the output terminal of the inverter 42 and the third input terminal thereof is supplied with a signal bACTUDSB from the above controller. The output terminal of the NAND gate 46 is connected to the input terminal of the inverter 43 whose output terminal is connected to the input terminal of the inverter 44. The first input terminal of the NOR gate 47 is supplied with the signal bACTUDSB from the above controller, the second input terminal thereof is connected to the output terminal of the inverter 42 and the third input terminal thereof is supplied with the signal bCSLTC. The output terminal of the NOR gate 47 is connected to the input terminal of the inverter 45. A signal bCOLACTWU output from the output terminal of the inverter 44 is supplied to the controller and a signal bCOLACTRU output from the output terminal of the inverter 45 is supplied to the controller. In the circuit shown in FIG. 10, the number of stages is reduced by supplying the various signals to the NOR gate 47 so as to shorten the random access time tRAC.

As shown in FIG. 11, the lower-side command decoder includes NOR gates 51, 52, inverters 53 to 61 and NAND gates 62 to 65. The input terminals of the NOR gate 51 are supplied with the respective signals bACTUDSB and PCWRITE output from the controller. The input terminals of the NOR gate 52 are supplied with the respective signals bACTUDSB and PCREAD output from the controller. One input terminal of the NAND gate 62 is supplied with a signal NOPLTC output from the controller and the other input terminal thereof is connected to the output terminal of the NOR gate 51. One input terminal of the NAND gate 63 is supplied with a signal NOPLTC output from the controller and the other input terminal thereof is connected to the output terminal of the NOR gate 52. One input terminal of the NAND gate 64 is connected to the output terminal of the inverter 53 and the other input terminal thereof is connected to the output terminal of the NOR gate 51. One input terminal of the NAND gate 65 is connected to the output terminal of the inverter 53 and the other input terminal thereof is connected to the output terminal of the NOR gate 52. The output terminals of the NAND gates 62 to 65 are respectively connected to the input terminals of the inverters 54 to 57 whose output terminals are respectively connected to the input terminals of the inverters 58 to 61. A signal bCOLACTR indicating that a lower address latch command LAL is input in a clock cycle next to the read command RDA is output from the output terminal of the inverter 58, a signal bCOLACTW indicating that the command LAL is input in a clock cycle next to the write command WRA is output from the output terminal of the inverter 59, a signal bMSET indicating that a command MRS is input in a clock cycle next to the command RDA is output from the output terminal of the inverter 60, and a signal bREFR indicating that a command REF is input in a clock cycle next to the command WRA is output from the output terminal of the inverter 61.

Figure 12:
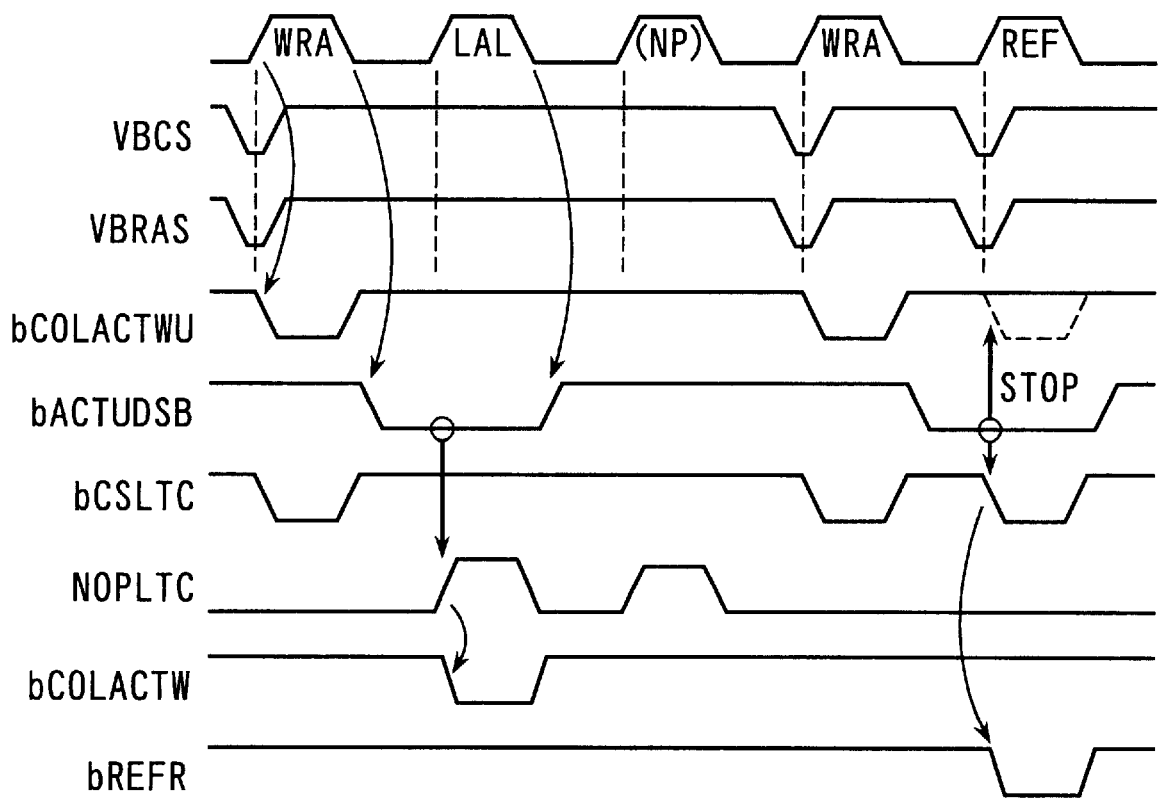
FIG. 12 is a timing chart for illustrating the operations of the controller and command decoder shown in FIGS. 9 to 11.

The operation with the above construction is explained with reference to the timing chart shown in FIG. 12. First, the signals bCSLTC and bRASLTC are changed according to the states of the respective potentials VBCS and VBRAS of the $\overline{CS}$ pin and $\overline{RAS}$ pin when the first command is input and the signal bCOLACTWU or bCOLACTRU is set to the "L" level (the former one in the case of FIG. 12). At this time, a corresponding one of the signals FCWRITE and FCREAD in the controller is set to the "H" level. The signal bACTUDSB is set to and maintained at the "L" level for one clock cycle from the fall of the clock signal after the first command is input so that the second command can be accepted. Further, the signal NOPLTC is a signal for detecting that the signal bCIN is at the "H" level, that is, NOP (No Operation) at the timing of rise of the clock signal, and as shown in the timing chart of FIG. 12, when the command LAL is input at the time of input of the second command, the signal bCOLACTW is set to the "L" level based on three conditions that the signal NOPLTC is set at the "H" level, the signal bACTUDSB is set at the "L" level and the signal FCWRITE is set at the "H" level (=RCREAD is set at the "L" level), and if the signal FCREAD is at the "H" level, the signal bCOLACTR is set to the "L" level, and thus, it is possible to detect that the command LAL is input for each case of the read/write operation. If the command REF or MRS (the difference therebetween depends on whether the first command is the command WRA or the command RDA) is input at the time of input of the second command, the signal bCSLTC is set to the "L" level and the signal bACTUDSB is set to the "L" level, and the signals bREFR and bMSET are set to the "L" level according to the state of FCREAD/FCWRITE. Further, at the same time, since the potential of the chip selection pin $\overline{CS}$ is set at the "L" level, the signal bACTUDSB is input to interrupt the operation so as to prevent the command decoder for the first command from being operated.

With the above construction, the following effects (A), (B) can be attained.

(A) Since the read/write mode is determined by the first command, not only the operation of the peripheral circuit but also the operation of the memory core can be started at the same time as the row address is fetched, and the random access can be started at earlier time than in a case wherein the start timing of the operation of the memory core is determined based on the second command as in the conventional case and the random access time tRAC is automatically made shorter by one cycle.

(B) Since the read/write mode is determined by the first command, it is only required to fetch the lower address LA at the time of input of the second command. Therefore, the process for selecting the column selection line CSL and outputting data is effected at earlier time than in the conventional case and the random access time tRAC can be shortened. Further, the word line WL can be early reset and the bit line can be precharged at earlier time, that is, the random access time tRC can be shortened by terminating the transfer of data to the peripheral circuit at earlier time. Thus, both of the random access time tRAC and the random cycle time tRC can be shortened.

In FIG. 6, at the time of input of the second command, the chip selection pin $\overline{CS}$ is set at the "H" level to latch the lower address LA, and additionally, if the chip selection pin $\overline{CS}$ is set at the "L" level, the auto-refresh cycle command REF and mode register set command MRS used in the conventional SDR/DDR-SDRAM are defined. The above commands are not directly related to this invention and the detail explanation therefor is omitted.

Figure 13A:
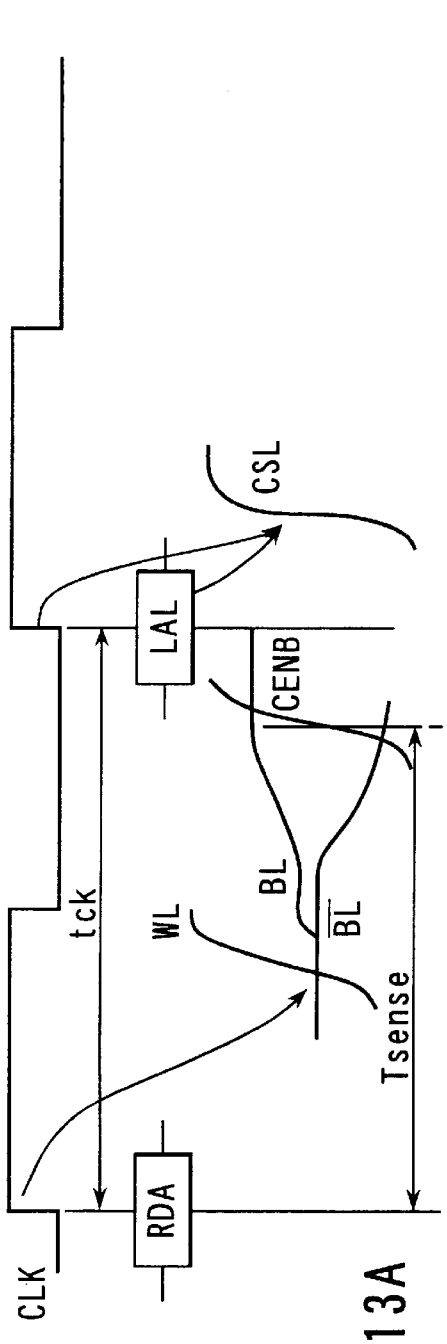
FIGS. 13A and 13B are timing charts for illustrating the operation for reading out data in a random fashion from a memory cell array in the semiconductor memory device according to the embodiment of this invention.

A series of above described operations is roughly divided into two cases depending on the cycle time tCK. The first one is a case wherein the cycle time tCK is relatively long. If the first command is a read command and the cycle time tCK is sufficiently longer than preset time Tsense (Tsense<tCK) required for selecting a word line WL according to the upper address UA, reading out data from the memory cell MC to the bit line pair BL, $\overline{BL}$ and amplifying the data by use of the bit line sense amplifier S/A, then the rise of the potential of the column selection line CSL occurs later than the preset time Tsense as shown in FIG. 13A, and therefore, an amount of data on the bit line pair BL, $\overline{BL}$ is large enough to transfer the data to the MDQ line pair and there occurs no problem.

Figure 13B:
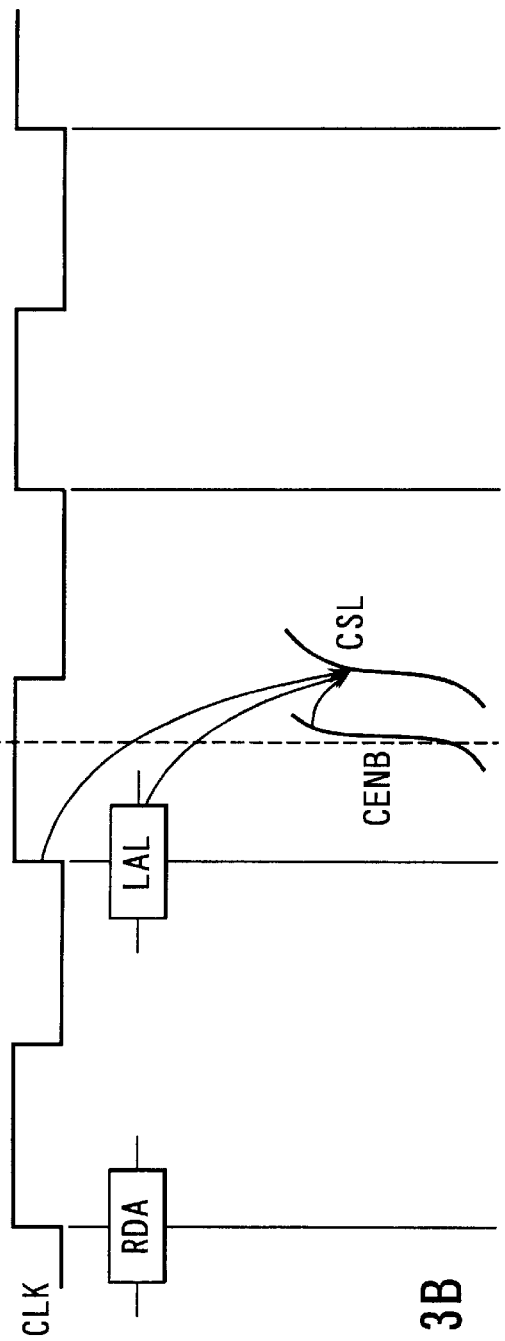

On the other hand, if the cycle time tCK becomes shorter, a case wherein the cycle time tCK becomes shorter than Tsense (Tsense>tCK) as shown in FIG. 13B may occur in some cases. In this case, data of the memory cell is not sufficiently amplified by the bit line sense amplifier S/A and if the column selection line CSL is selected immediately after the second command is input, division of the capacitance is rapidly made between the bit line pair and the MDQ line pair and cell data will be destroyed in the worst case. Therefore, if the cycle time tCK is short, a so-called gating signal which permits the potential of the column selection line CSL to be raised after the elapse of the preset time Tsense is used in the internal portion and the rise timing of the potential of the column selection line CSL is shifted to substantially the later timing to attain sufficient amplification time for cell data by the bit line sense amplifier.

Figure 14:
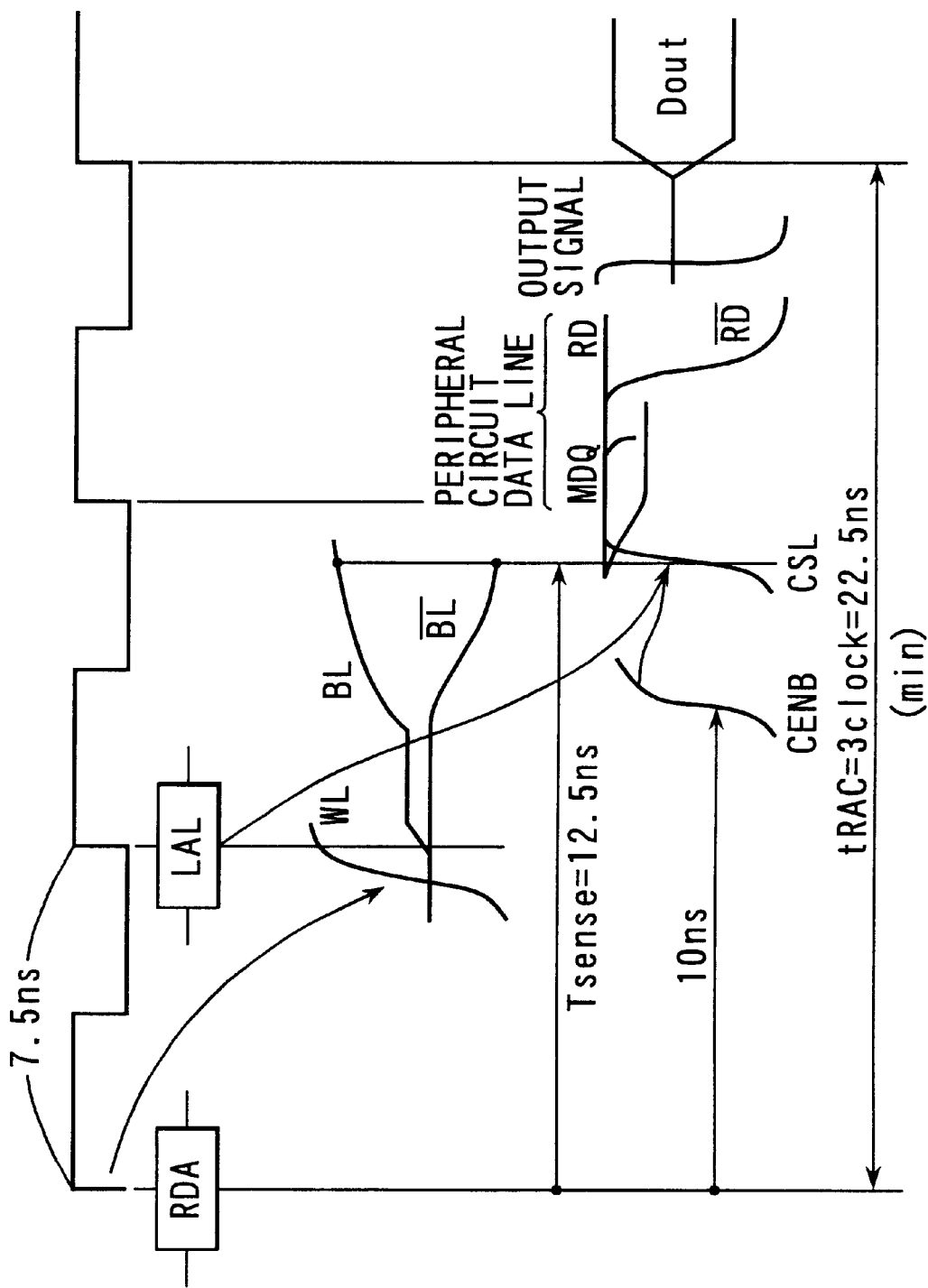
FIG. 14 is a timing chart for illustrating an example of the definition of the random access time in a first command (read) according to cycle time.

FIG. 14 shows an example of the definition of the random access time tRAC in the first command (read) according to the cycle time tCK. In this example, the random access time tRAC is so set as to become shortest (three clocks=22.5 ns) when the cycle time tCK=7.5 ns (133 MHz) and the gating signal CENB is so set as to be enabled approx. 10 ns after the first command or approx. 2.5 ns after the second command. Approx. 12.5 ns is required for the time Tsense, the potential of the column selection line CSL rises in response to the rise of the gating signal CENB and the clock edge of the second command, and after this, data is output based on the above operation.

Figure 15A:
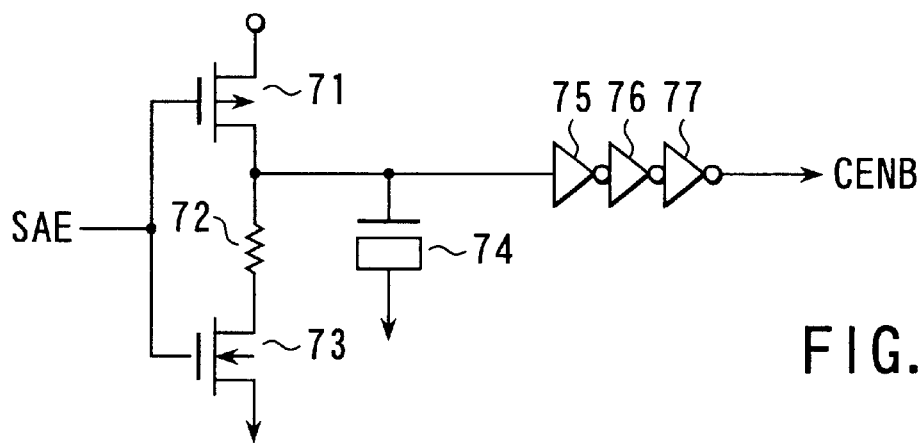
FIG. 15A is a circuit diagram showing an example of the concrete construction of a gating signal generating circuit.
Figure 15B:
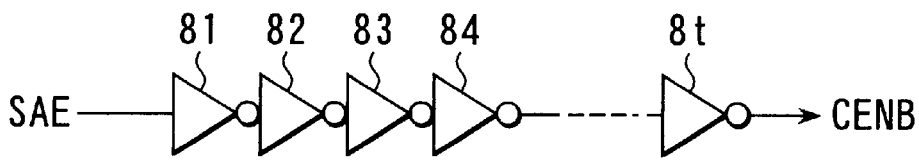
FIG. 15B is a circuit diagram showing another example of the concrete construction of a gating signal generating circuit.
Figure 15C:
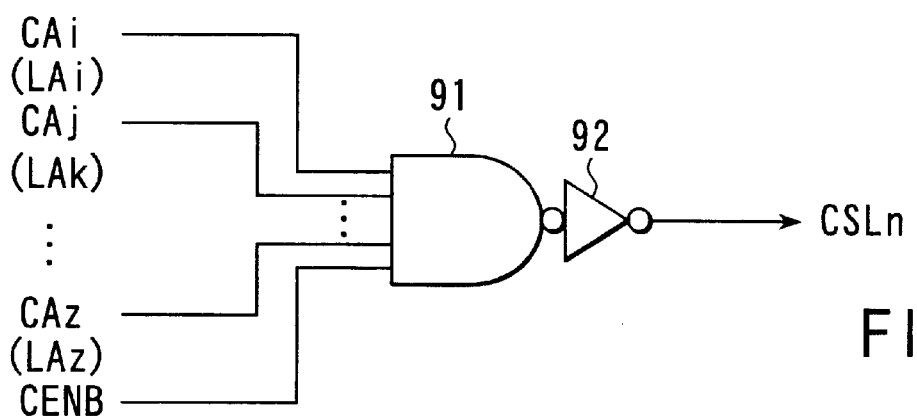
FIG. 15C is a circuit diagram showing an example of the concrete construction of a column decoder.

FIGS. 15A and 15B show examples of the concrete construction of a circuit for generating the gating signal CENB and FIG. 15C shows an example of the concrete construction of the column decoder. FIG. 15A shows a gating signal generating circuit using an RC delay circuit and including a P-channel MOS transistor 71, resistor 72, N-channel MOS transistor 73, capacitor 74 and inverters 75, 76, 77. The current path of the MOS transistor 71, the resistor 72 and the current path of the MOS transistor 73 are serially connected between. the power supply and the ground node. A signal (sense amplifier enable signal) SAE for enabling the operation of the bit line sense amplifier is supplied to the gates of the MOS transistors 71, 73. One-side electrode of the capacitor is connected to a connection node of the MOS transistor 71 and the resistor 72 and the other electrode thereof is connected to the ground node. The input terminal of the inverter 75 is connected to the connection node of the MOS transistor 71 and the resistor 72 and the output terminal thereof is connected to the input terminal of the inverter 76. The output terminal of the inverter 76 is connected to the input terminal of the inverter 77 and the gating signal CENB is output from the output terminal of the inverter 77.

The gating signal generating circuit shown in FIG. 15B includes t-stage (even number of stages) cascade-connected inverters 81, 82, . . . , 8t and the gating signal CENB is output from the final-stage inverter 8t.

As shown in FIG. 15C, the column decoder includes a NAND gate 91 and inverter 92. The input terminals of the NAND gate 91 are respectively supplied with column address signals CAi(LAi), CAj(LAj), . . . , CAz(LAz) and the gating signal CENB output from the gating signal generating circuit shown in FIG. 15A or 15B. An output signal of the NAND gate 91 is supplied to the inverter 92 and a column selection signal CSLn is output from the output terminal of the inverter 92.

With the above construction, the memory core access operation is effected after input of the first command, the word line is selected and then a signal (sense amplifier enable signal) SAE for enabling the operation of the bit line sense amplifier rises. The gating signal CENB is set to the "H" level with delay time corresponding to a period of time from the rise of the sense amplifier enable signal SAE to the bit line sense operation. The gating signal CENB is supplied to a middle portion of the critical path of the column selection line CSL which is started from input of the second command, for example, the column decoder in an example shown in FIGS. 15A to 15C to control the operation thereof. Thus, by raising the potential of the column selection line CSL according to the logical product (AND) of the gating signal CENB and a clock edge after input of the second command, it is possible to read out cell data to the output pin after the stable sense operation is attained if the cycle time tCK is short and simply raise the potential of the column selection line CSL in response to the clock edge of the second command and output data if the cycle time tCK is long.

Unlike the case described in the above International Application, data access time from the row access command ACT, that is, random access time tRAC does not always take an extra one clock cycle. In addition, an increase in the logic construction of the internal circuit by making the command decoding operation extremely complicated when the row access command ACT and column access command RD are simultaneously input does not occur and an increase in the number of input pins of the device does not occur. Further, there is no extra delay time which may be considered to occur in the front half portion of the random access time tRAC. In addition, since the command is not complicated, an increase in the package size and an increase in the cost will not occur.

Figure 16A:
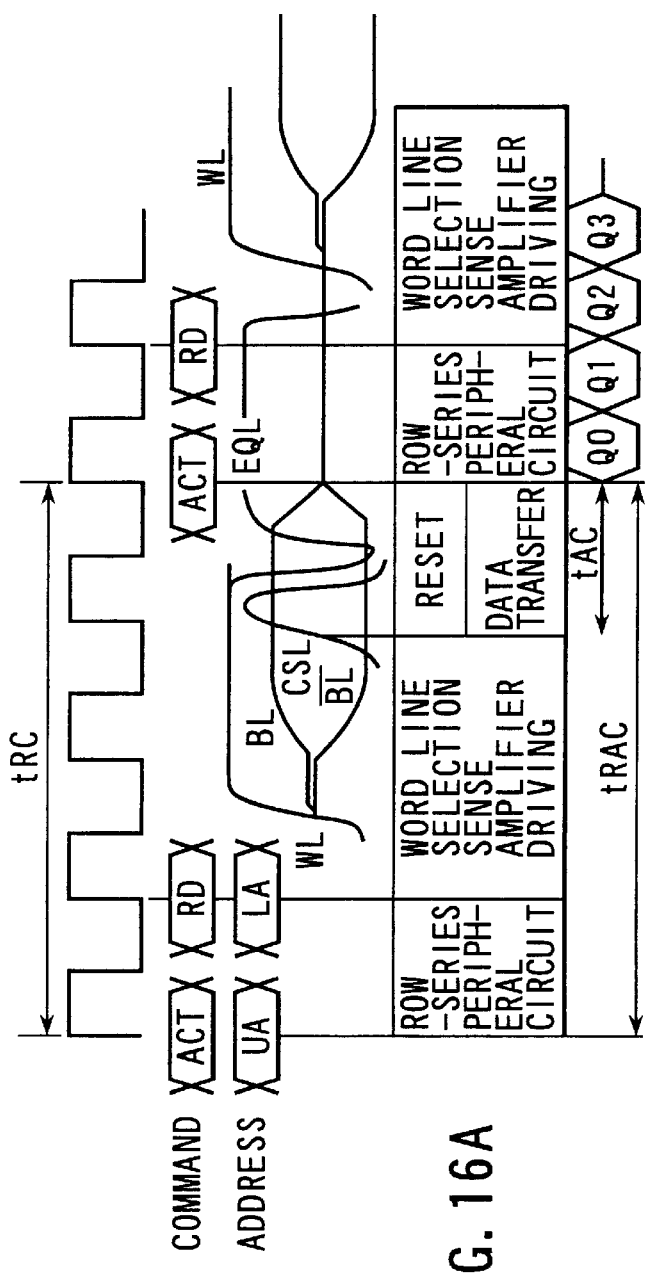
FIGS. 16A and 16B are timing charts showing the random data readout operation of the conventional semiconductor memory device, for illustrating the general operations of the conventional semiconductor memory device and the semiconductor memory device according to this invention in comparison with each other.
Figure 16B:
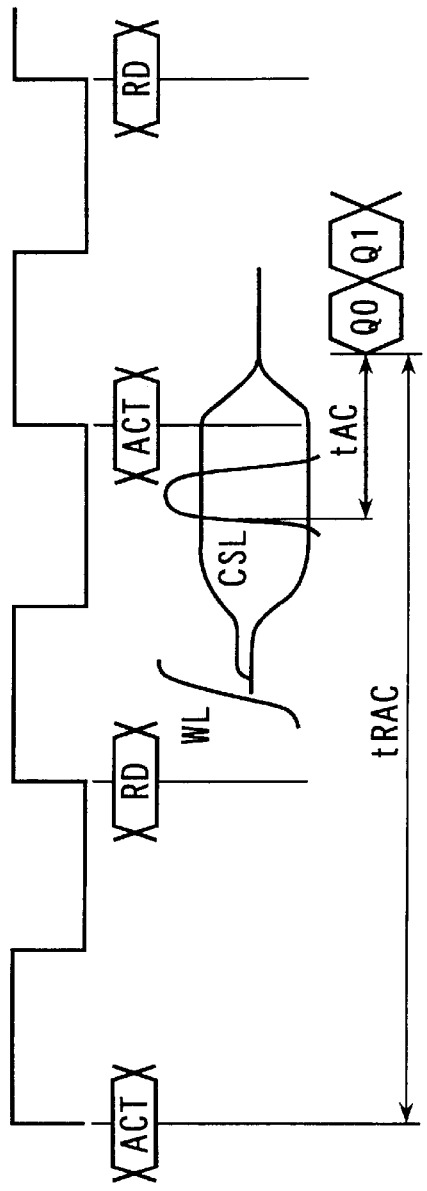
Figure 17:
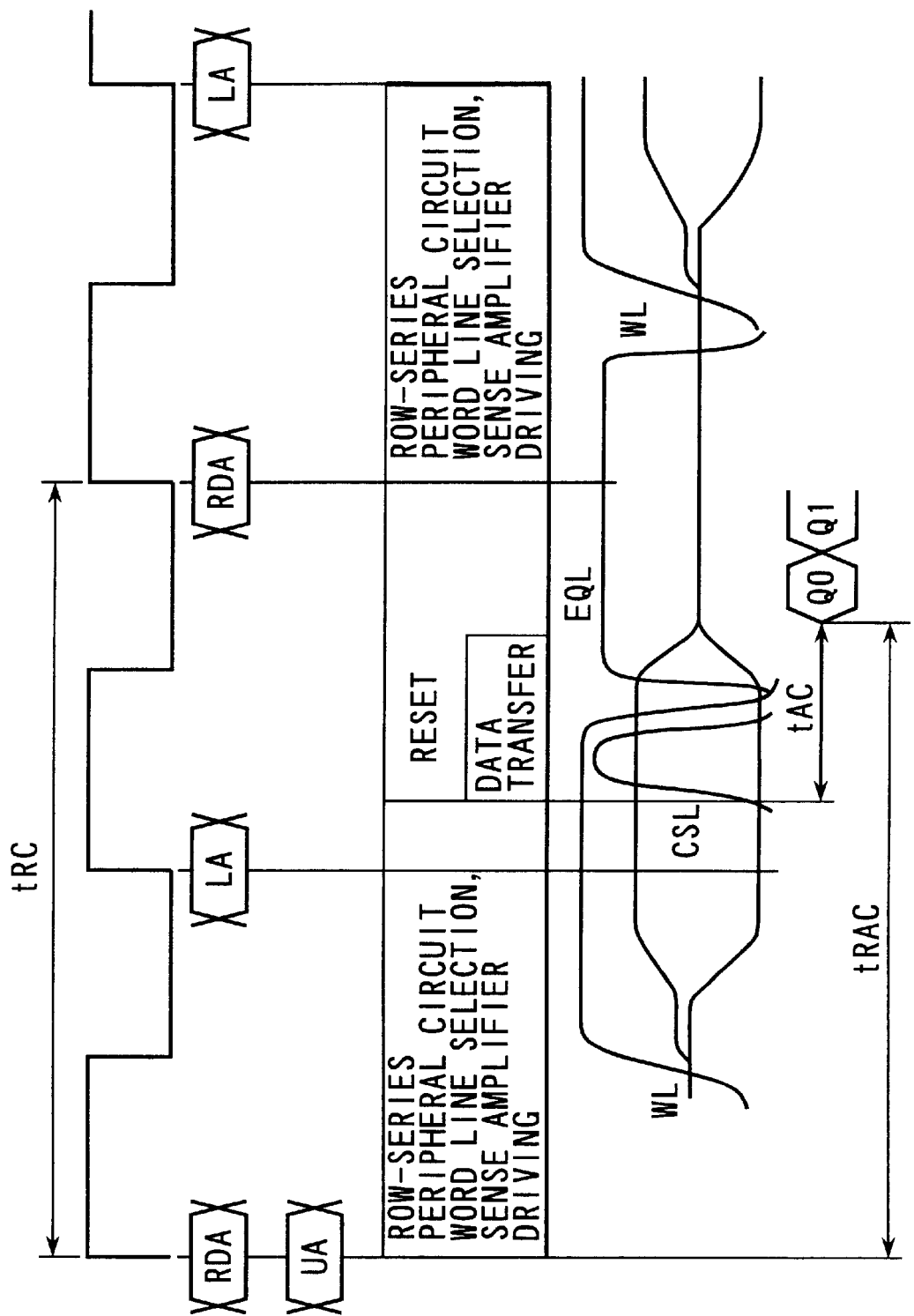
FIG. 17 is a timing chart showing the random data readout operation of the semiconductor memory device according to this invention, for illustrating the general operations of the conventional semiconductor memory device and the semiconductor memory device according to this invention in comparison with each other.

FIGS. 16A, 16B and 17 are timing charts for generally comparing the conventional system with the system of this invention. FIGS. 16A and 16B show the conventional system in which the row access command ACT and upper address UA are input in synchronism with a rise of the clock signal to operate the row-series peripheral circuit, the column access command RD and lower address LA are input in synchronism with a next rise of the clock signal to select the word line WL and drive the sense amplifier, and then effect the reset operation and data transfer operation.

On the other hand, in the system of this invention shown in FIG. 17, the read command RDA (or write command WRA) and upper address UA are input in synchronism with a rise of the clock signal to operate the row-series peripheral circuit, select the word line WL and drive the sense amplifier, and then the lower address LA is input in synchronism with a next rise of the clock signal to effect the reset operation and data transfer operation.

As is clearly understood by comparing the timing charts of FIGS. 16 and 17, according to this invention, the speed of the random data readout operation from the memory cell array can be enhanced without degrading the random access time tRAC.

As described above, according to this invention, a semiconductor memory device and a data readout method therefor can be attained in which the speed of the random data readout operation from the memory cell array can be enhanced without degrading the random access time.

Further, a semiconductor memory device can be attained in which the speed of the random data readout operation from the memory cell array can be enhanced while the command decoding process is prevented from becoming complicated and an increase in the logic construction of the internal circuit is suppressed.

In addition, a semiconductor memory device can be attained in which the speed of the random data readout operation from the memory cell array can be enhanced while an increase in the cost due to an increase in the number of pins and an increase in the package size can be suppressed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device in which first and second commands are input to effect a read/write operation of random data with respect to a memory cell array in synchronism with a clock signal and a row access command and a column access command for data readout are supplied as one packet in two successive clock cycles, comprising:

a first pin supplied with a signal which distinguishes a read command and a write command;

second pins supplied with upper-side and lower-side decode addresses;

a controller to which a signal indicating that the read command is input and a signal indicating that the write command is input based on the signal input to said first pin are supplied;

a first command decoder controlled by an output signal of said controller, which defines the readout/write operation by use of the first command, fetches an upper-side decode address of a memory cell array via said second pin and decodes the first command; and a lower-side command decoder controlled by an output signal of said controller, which fetches a lower-side decode address of the memory cell array via the control pin in response to the second command, decodes the lower-side command and outputs a lower address latch command, mode register set command and auto-refresh command.

2. The semiconductor memory device according to claim 1, wherein existing pins are also used as said second pins.

3. The semiconductor memory device according to claim 2, wherein said existing pins are a write enable pin and column address strobe pin in an SDR-SDRAM or DDR-SDRAM.

4. The semiconductor memory device according to claim 1, further comprising a gating signal generating circuit which controls activation of a column selection line to permit the shortest time required for amplifying random readout data from the memory cell array to occur later than a period of time from when the second command is supplied until the column selection line is selected.

5. The semiconductor memory device according to claim 4, which further comprises a column decoder supplied with a column address signal and a gating signal output from said gating signal generating circuit, said column decoder outputting a column selection signal to the column selection line and in which activation of the column selection line is controlled by the gating signal.

* * * * *